(12) United States Patent
Weaver et al.

(10) Patent No.: US 8,827,488 B2
(45) Date of Patent: Sep. 9, 2014

(54) OLED DISPLAY ARCHITECTURE

(75) Inventors: Michael S. Weaver, Princeton, NJ (US);
Michael Hack, Lambertville, NJ (US);
Louis D. Silverstein, Scottsdale, AZ (US)

(73) Assignee: Universal Display Corporation, Ewing, NJ (US)

( * ) Notice: Subject to any disclaimer, the term of this patent is extended or adjusted under 35 U.S.C. 154(b) by 689 days.

(21) Appl. No.: 13/082,851

(22) Filed: Apr. 8, 2011

(65) Prior Publication Data

US 2011/0248294 A1  Oct. 13, 2011

Related U.S. Application Data

(63) Continuation-in-part of application No. 12/565,115, filed on Sep. 23, 2009.

(60) Provisional application No. 61/101,757, filed on Oct. 1, 2008.

(51) Int. Cl.
| | |
|---|---|
| *F21V 9/00* | (2006.01) |
| *H01L 25/04* | (2014.01) |
| *H01L 27/32* | (2006.01) |
| *H01L 51/50* | (2006.01) |

(52) U.S. Cl.
CPC .......... *H01L 27/3213* (2013.01); *H01L 25/048* (2013.01); *H01L 2251/5376* (2013.01); *H01L 51/5016* (2013.01); *H01L 2251/55* (2013.01); *H01L 27/3209* (2013.01)
USPC ...................................... 362/231; 362/249.02

(58) Field of Classification Search
USPC ............................................ 362/231, 249.02
See application file for complete search history.

(56) References Cited

U.S. PATENT DOCUMENTS

| 4,769,292 A | 9/1988 | Tang et al. |
| 4,886,343 A | 12/1989 | Johnson |

(Continued)

FOREIGN PATENT DOCUMENTS

| JP | 2007-122033 | 5/2007 |
| JP | 2007-123065 | 5/2007 |

(Continued)

OTHER PUBLICATIONS

Office Action in U.S. Appl. No. 12/565,115 mailed Jan. 12, 2012.

(Continued)

*Primary Examiner* — Sean Gramling
(74) *Attorney, Agent, or Firm* — Sterne, Kessler, Goldstein & Fox P.L.L.C.

(57) ABSTRACT

A device that may be used as a multi-color pixel is provided. The device has a first organic light emitting device, a second organic light emitting device, a third organic light emitting device, and a fourth organic light emitting device. The device may be a pixel of a display having four sub-pixels. The first device may emit red light, the second device may emit green light, the third device may emit light blue light and the fourth device may emit deep blue light. The device includes a first device plane and a second device plane. The first device plane comprises a plurality of the first organic light emitting device and a plurality of the second organic light emitting device. The second device plane comprises a plurality of at least one of the third organic light emitting device and the fourth organic light emitting device. The planes of the first and second device planes are parallel. The second device plane is transposed from the first device plane in a direction perpendicular to the planes of the first and second device planes. The first and second device planes are superposed.

11 Claims, 12 Drawing Sheets

(56) References Cited

U.S. PATENT DOCUMENTS

| | | | |
|---|---|---|---|
| 5,247,190 | A | 9/1993 | Friend et al. |
| 5,642,125 | A | 6/1997 | Silverstein et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,366,025 | B1 | 4/2002 | Yamada |
| 6,468,819 | B1 | 10/2002 | Kim et al. |
| 6,747,618 | B2 | 6/2004 | Arnold et al. |
| 6,771,028 | B1 | 8/2004 | Winters |
| 7,091,986 | B2 | 8/2006 | Phan |
| 7,215,347 | B2 | 5/2007 | Phan |
| 7,279,704 | B2 | 10/2007 | Walters et al. |
| 7,431,968 | B1 | 10/2008 | Shtein et al. |
| 7,791,565 | B2 | 9/2010 | Fish et al. |
| 2002/0015859 | A1* | 2/2002 | Watanabe et al. ............ 428/690 |
| 2002/0186214 | A1 | 12/2002 | Siwinski |
| 2003/0042848 | A1 | 3/2003 | Park et al. |
| 2003/0230980 | A1 | 12/2003 | Forrest et al. |
| 2004/0032205 | A1 | 2/2004 | Hack et al. |
| 2004/0113875 | A1 | 6/2004 | Miller et al. |
| 2004/0174116 | A1 | 9/2004 | Lu et al. |
| 2004/0201558 | A1 | 10/2004 | Arnold et al. |
| 2005/0258433 | A1 | 11/2005 | Djurovich et al. |
| 2006/0231842 | A1 | 10/2006 | Hirakata et al. |
| 2007/0001584 | A1 | 1/2007 | Lee et al. |
| 2007/0015429 | A1 | 1/2007 | Maeda et al. |
| 2007/0164664 | A1 | 7/2007 | Ludwicki et al. |
| 2007/0222800 | A1* | 9/2007 | Fish et al. ............... 345/694 |
| 2008/0203905 | A1 | 8/2008 | Je et al. |
| 2008/0224968 | A1 | 9/2008 | Kashiwabara |
| 2009/0261715 | A1 | 10/2009 | Sung et al. |
| 2010/0013378 | A1 | 1/2010 | D'Andrade |
| 2010/0090620 | A1 | 4/2010 | Hack et al. |
| 2010/0225252 | A1 | 9/2010 | Weaver et al. |

FOREIGN PATENT DOCUMENTS

| | | |
|---|---|---|
| WO | WO 2009/107596 | 9/2009 |
| WO | WO 2010/000976 | 1/2010 |
| WO | WO 2010/039938 | 4/2010 |

OTHER PUBLICATIONS

Final Rejection mailed Aug. 31, 2012 for U.S. Appl. No. 12/565,115, filed Sep. 23, 2009; 16 pages.

Non-Final Rejection mailed Jun. 13, 2012 for U.S. Appl. No. 12/752,792, filed Apr. 1, 2010; 14 pages.

Final Rejection mailed Jan. 30, 2013 for U.S. Appl. No. 12/752,792, filed Apr. 1, 2010; 16 pages.

Baldo et al., "Highly Efficient Phosphorescent Emission from Organic Electroluminescent Devices," Nature, vol. 395, 151-154, 1998.

Baldo et al., "Very high-efficiency green organic light-emitting devices based on electrophosphorescence," Appl. Phys. Lett., vol. 75, No. 3, 4-6 (1999).

M. S. Weaver et al., "Phosphorescent OLED-s for displays and lighting," UDC, Proceedings of the International Display Manufacturing Conference, pp. 328-331 (2007).

B. D'Andrade et al., "Blue phosphorescent organic light emitting device stability analysis," UDC, Society for Information Display Digest of Technical Papers 34, 2, pp. 712-715 (2008).

Funahashi et al., "Highly efficient fluorescent deep blue dopant for "Super Top Emission" Device," Society for Information Display Digest of Technical Papers 47. 3, pp. 709-711 (2008).

Baek-woon Lee et al., "Micro-cavity design of RGBW AMOLED for 100% color gamut," Society for Information Display Digest of Technical Papers 68.4, pp. 1050-1053 (2008).

A. Arnold, T. K. Hatwar, M. Hettel, P. Kane, M. Miller, M. Murdoch, J. Spindler, S. V. Slyke, Proc, Asia Display (2004).

J. P. Spindler et al., "Lifetime- and power-enhanced RGBW displays based on white OLEDs," SID 2005 International Symposium Technical Digest 36, 1, pp. 36-39 (2005).

Du-Zen Peng, et al, "Challenges for small- and medium-sized AMOLED displays," Information Display 23, 2, pp. 12-18 (2007).

B-W. Lee et al. "Late-News Paper: TFT-LCD with RGBW Color System" SID 03 Digest, pp. 1212-1215 (2003).

The International Search Report corresponding to the PCT/US2009/059202 application.

The International Search Report corresponding to the PCT/US2010/029796 application.

Franky So , "Organic Electronics: Materials, Processing, Devices and Applications", CRC Press, p. 448-p. 449 (2009).

Woo-Young So et al., "Power Efficient AMOLED Display with Novel Four Sub-Pixel Architecture and Driving Scheme" paper 44.3, SID Digest (2010).

Jiun-Haw Lee et al., Journal of the Electrochemical Society, 154 (7) J226-J228 (2007).

The International Search Report received in PCT/US2012/032522.

* cited by examiner

OLED DISPLAY ARCHITECTURE

This application is a continuation-in-part of U.S. patent application Ser. No. 12/565,115 titled Novel OLED Display Architecture, filed Sep. 23, 2009, which claims priority to and benefit under 35 U.S.C. §119(e) to U.S. Provisional Application No. 61/101,757, filed Oct. 1, 2008, the disclosures of which are herein expressly incorporated by reference in their entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and more specifically to the use of both light and deep blue organic light emitting devices to render color.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for organic emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

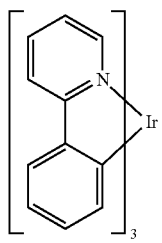

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A device that may be used as a multi-color pixel is provided. The device has a first organic light emitting device, a second organic light emitting device, a third organic light emitting device, and a fourth organic light emitting device. The device may be a pixel of a display having four sub-pixels.

The first organic light emitting device emits red light, the second organic light emitting device emits green light, the third organic light emitting device emits light blue light, and the fourth organic light emitting device emits deep blue light. The peak emissive wavelength of the fourth device is at least 4 nm less than that of the third device. As used herein, "red" means having a peak wavelength in the visible spectrum of 600-700 nm, "green" means having a peak wavelength in the visible spectrum of 500-600 nm, "light blue" means having a peak wavelength in the visible spectrum of 400-500 nm, and "deep blue" means having a peak wavelength in the visible spectrum of 400-500 nm, where "light" and "deep" blue are distinguished by a 4 nm difference in peak wavelength. Preferably, the light blue device has a peak wavelength in the visible spectrum of 465-500 nm, and "deep blue" has a peak wavelength in the visible spectrum of 400-465 nm The first, second, third and fourth organic light emitting devices each have an emissive layer that includes an organic material that emits light when an appropriate voltage is applied across the device. The emissive material in each of the first and second organic light emissive devices is a phosphorescent material. The emissive material in the third organic light emitting device is a fluorescent material. The emissive material in the fourth organic light emitting device may be either a fluorescent material or a phosphorescent material. Preferably, the emissive material in the fourth organic light emitting device is a phosphorescent material.

The first, second, third and fourth organic light emitting devices may have the same surface area, or may have different surface areas. The first, second, third and fourth organic light emitting devices may be arranged in a quad pattern, in a row, or in some other pattern.

The device may be operated to emit light having a desired CIE coordinate by using at most three of the four devices for any particular CIE coordinate. Use of the deep blue device may be significantly reduced compared to a display having only red, green and deep blue devices. For the majority of images, the light blue device may be used to effectively render the blue color, while the deep blue device may need to be illuminated only when the pixels require highly saturated blue colors. If the use of the deep blue device is reduced, then in addition to reducing power consumption and extending display lifetime, this may also allow for a more saturated deep blue device to be used with minimal loss of lifetime or efficiency, so the color gamut of the display can be improved.

The device may be a consumer product.

A first device is provided. The device includes a plurality of pixels, wherein each pixel includes an R sub-pixel, a G sub-pixel, a B1 sub-pixel and a B2 sub-pixel. Each R sub-pixel comprises a first organic light emitting device that emits light having a peak wavelength in the visible spectrum of 580-700 nm, further comprising a first emissive layer having a first emitting material. Each G sub-pixel comprises a second organic light emitting device that emits light having a peak wavelength in the visible spectrum of 500-580 nm, further comprising a second emissive layer having a second emitting material. Each B1 sub-pixel comprises a third organic light emitting device that emits light having a peak wavelength in the visible spectrum of 400-500 nm, further comprising a third emissive layer having a third emitting material. Each B2 sub-pixel comprises a fourth organic light emitting device that emits light having a peak wavelength in the visible spectrum of 400 to 500 nm, further comprising a fourth emissive layer having a fourth emitting material. The third emitting material is different from the fourth emitting material. The peak wavelength in the visible spectrum of light emitted by the fourth organic light emitting device is at least 4 nm less than the peak wavelength in the visible spectrum of light emitted by the third organic light emitting device.

The first device includes a first device plane and a second device plane. The first device plane comprises a plurality of the first organic light emitting device and a plurality of the second organic light emitting device. The second device plane comprises a plurality of at least one of the third organic light emitting device and the fourth organic light emitting device. The planes of the first and second device planes are parallel. The second device plane is transposed from the first device plane in a direction perpendicular to the planes of the first and second device planes. The first and second device planes are superposed.

In one embodiment, the second device plane comprises a plurality of the third organic light emitting device, and a plurality of the fourth organic light emitting device.

In one embodiment, the first device plane comprises a plurality of the first organic light emitting device, a plurality of the second organic light emitting device, and a plurality of the third organic light emitting device. The second device plane comprises a plurality of the fourth organic light emitting device.

In one embodiment, the first device plane comprises a plurality of the first organic light emitting device, a plurality of the second organic light emitting device, and a plurality of the fourth organic light emitting device. The second device plane comprises a plurality of the third organic light emitting device.

Preferably, at least one of the first and second device planes each has a fill factor of at least 30%.

Preferably, the first device is configured such that the first device plane is closer to a viewing direction than the second device plane.

The first device may be a display panel. The first device may be a consumer device.

In one preferred embodiment, the first, second and third emitting materials are phosphorescent, and the fourth emitting material is fluorescent. In one preferred embodiment, the first and second emitting materials are phosphorescent, and the third and fourth emitting materials are fluorescent. A variety of other combinations of emitting material types may be used, such as where the first, second, third and fourth emitting materials are phosphorescent.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
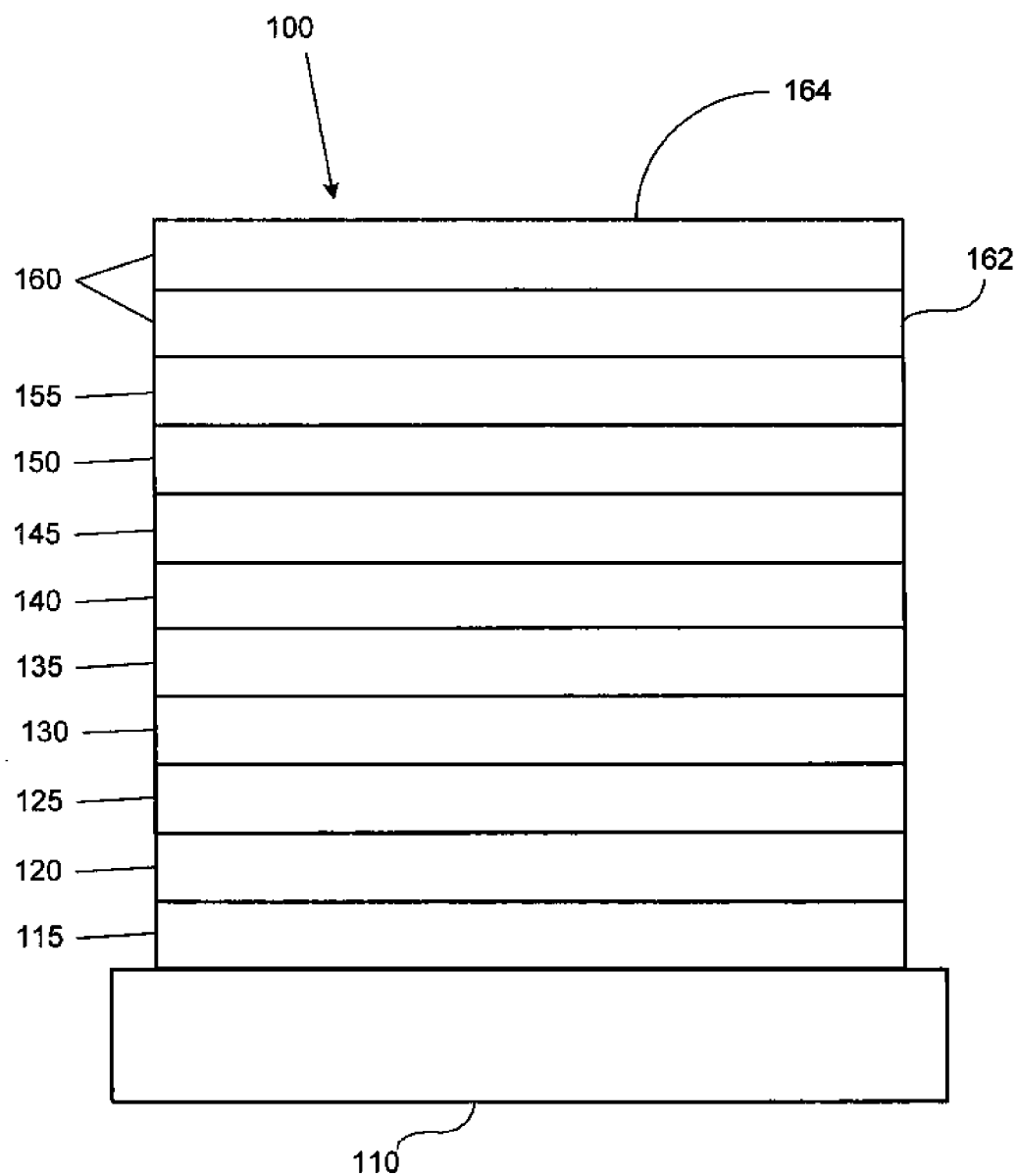
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
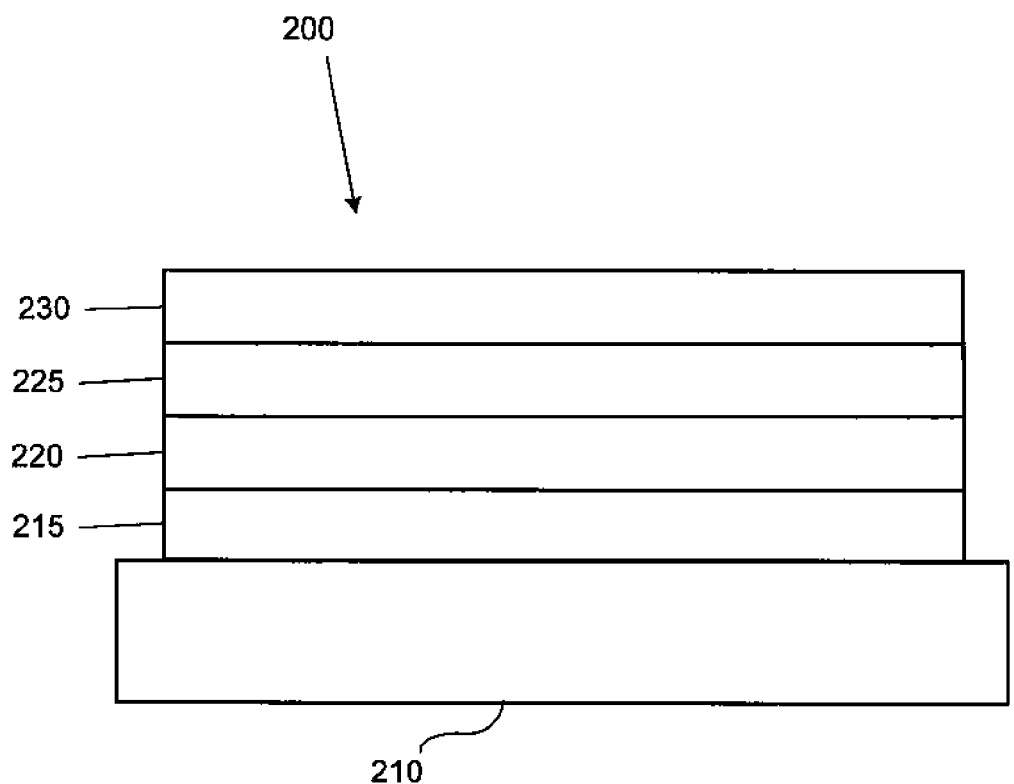
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition WPM, such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, high resolution monitors for health care applications, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

One application for organic emissive molecules is a full color display, preferably an active matrix OLED (AMOLED) display. One factor that currently limits AMOLED display lifetime and power consumption is the lack of a commercial blue OLED with saturated CIE coordinates with sufficient device lifetime.

Figure 3:
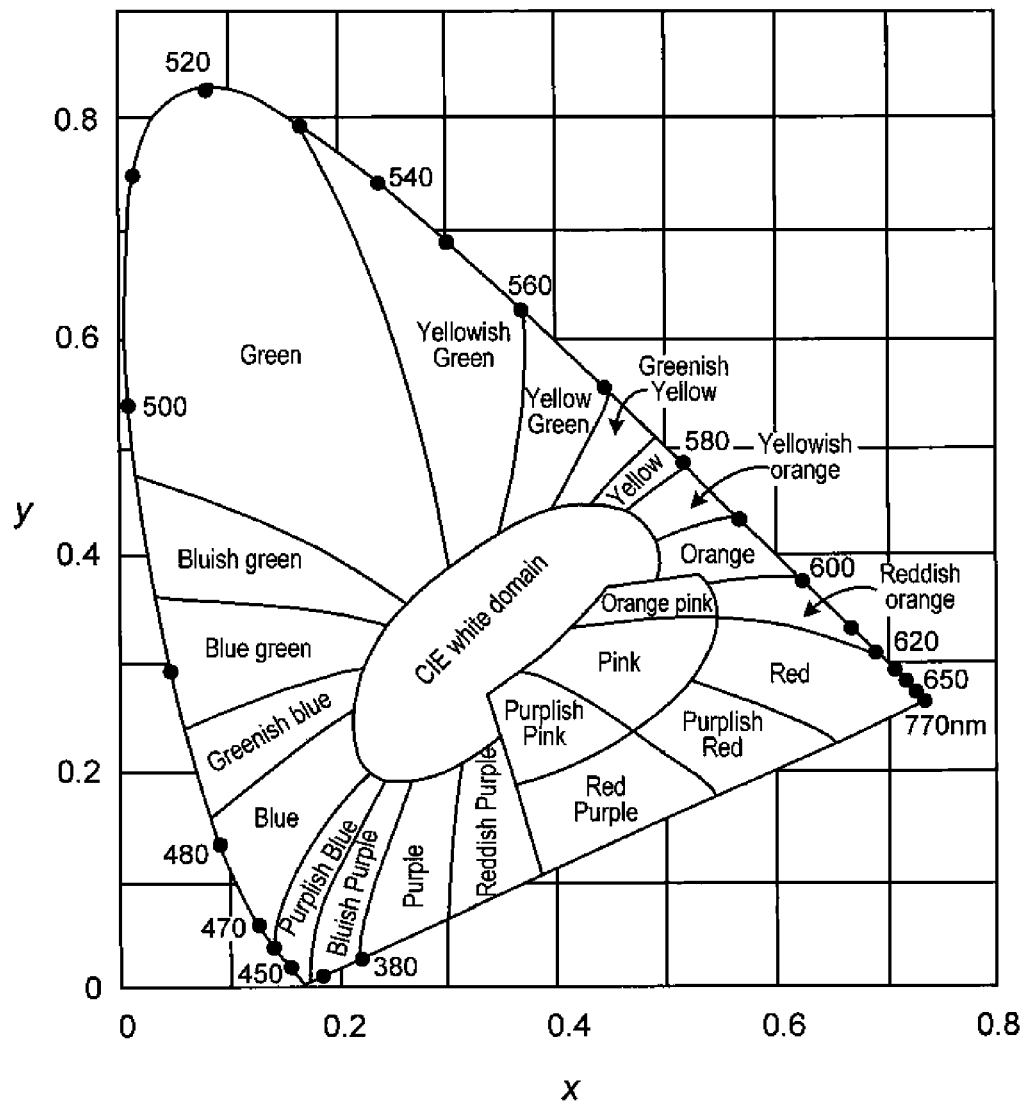
FIG. 3 shows a rendition of the 1931 CIE chromaticity diagram.

FIG. 3 shows the 1931 CIE chromaticity diagram, developed in 1931 by the International Commission on Illumination, usually known as the CIE for its French name Commission Internationale de l'Eclairage. Any color can be described by its x and y coordinates on this diagram. A "saturated" color, in the strictest sense, is a color having a point spectrum, which falls on the CIE diagram along the U-shaped curve running from blue through green to red. The numbers along this curve refer to the wavelength of the point spectrum. Lasers emit light having a point spectrum.

Figure 4:
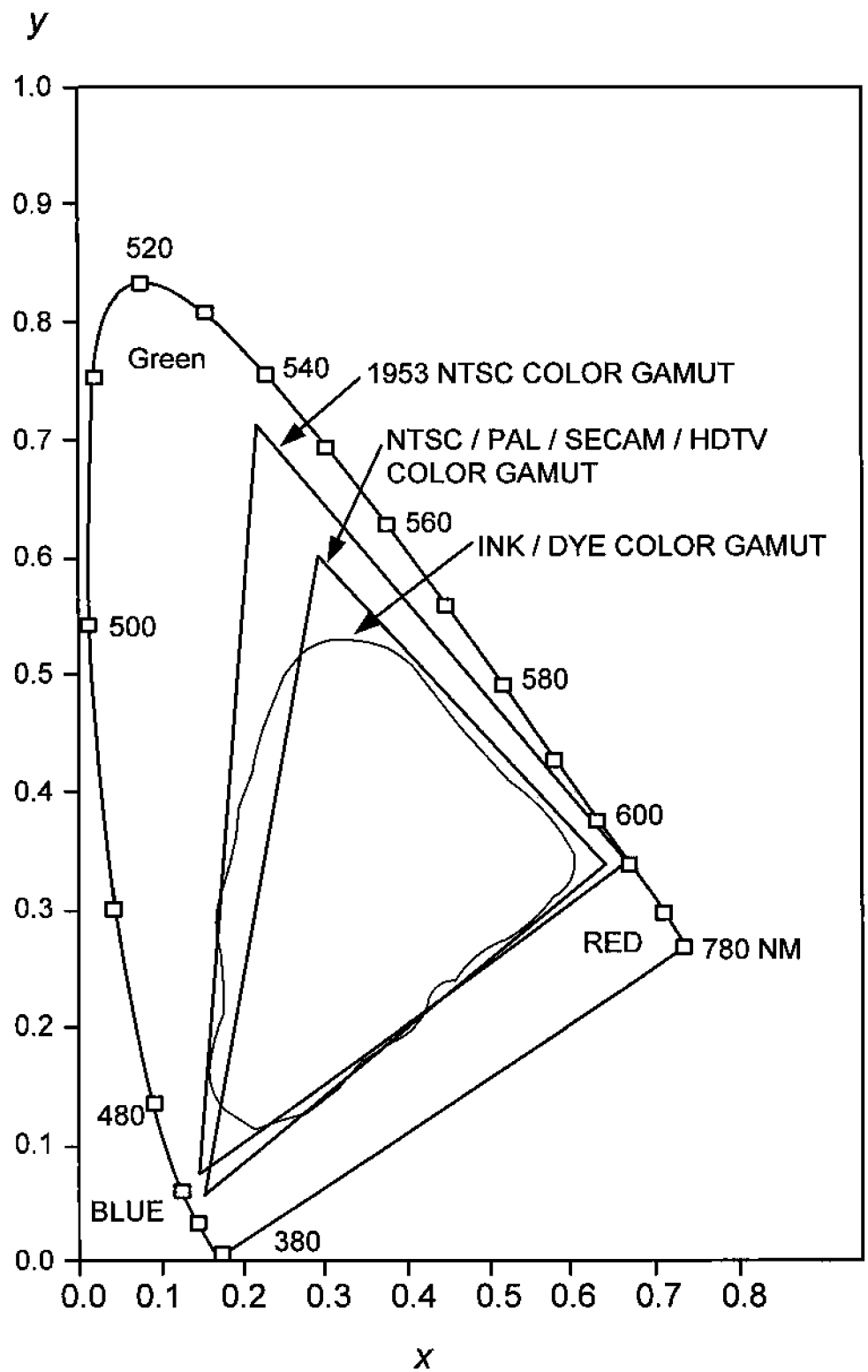
FIG. 4 shows a rendition of the 1931 CIE chromaticity diagram that also shows color gamuts.

FIG. 4 shows another rendition of the 1931 chromaticity diagram, which also shows several color "gamuts." A color gamut is a set of colors that may be rendered by a particular display or other means of rendering color. In general, any given light emitting device has an emission spectrum with a particular CIE coordinate. Emission from two devices can be combined in various intensities to render color having a CIE coordinate anywhere on the line between the CIE coordinates of the two devices. Emission from three devices can be combined in various intensities to render color having a CIE coordinate anywhere in the triangle defined by the respective coordinates of the three devices on the CIE diagram. The three points of each of the triangles in FIG. 4 represent industry standard CIE coordinates for displays. For example, the three points of the triangle labeled "NTSC/PAL/SECAM/HDTV gamut" represent the colors of red, green and blue (RGB) called for in the sub-pixels of a display that complies with the standards listed. A pixel having sub-pixels that emit the ROB colors called for can render any color inside the triangle by adjusting the intensity of emission from each sub-pixel.

The CIE coordinates called for by NTSC standards are: red (0.67, 0.33); green (0.21, 0.72); blue (0.14, 0.08). There are devices having suitable lifetime and efficiency properties that are close to the blue called for by industry standards, but remain far enough from the standard blue that the display fabricated with such devices instead of the standard blue would have noticeable shortcomings in rendering blues. The blue called for industry standards is a "deep" blue as defined below, and the colors emitted by efficient and long-lived blue devices are generally "light" blues as defined below.

A display is provided which allows for the use of a more stable and long lived light blue device, while still allowing for the rendition of colors that include a deep blue component. This is achieved by using a quad pixel, i.e., a pixel with four devices. Three of the devices are highly efficient and long-lived devices, emitting red, green and light blue light, respectively. The fourth device emits deep blue light, and may be less efficient or less long lived that the other devices. However, because many colors can be rendered without using the fourth device, its use can be limited such that the overall lifetime and efficiency of the display does not suffer much from its inclusion.

A device is provided. The device has a first organic light emitting device, a second organic light emitting device, a third organic light emitting device, and a fourth organic light emitting device. The device may be a pixel of a display having four sub-pixels. A preferred use of the device is in an active matrix organic light emitting display, which is a type of device where the shortcomings of deep blue OLEDs are currently a limiting factor.

The first organic light emitting device emits red light, the second organic light emitting device emits green light, the third organic light emitting device emits light blue light, and the fourth organic light emitting device emits deep blue light. The peak emissive wavelength of the fourth device is at least 4 nm less than that of the third device. As used herein, "red" means having a peak wavelength in the visible spectrum of 600-700 nm, "green" means having a peak wavelength in the visible spectrum of 500-600 nm, "light blue" means having a peak wavelength in the visible spectrum of 400-500 nm, and "deep blue" means having a peak wavelength in the visible spectrum of 400-500 nm, where "light" and "deep" blue are distinguished by a 4 nm difference in peak wavelength. Preferably, the light blue device has a peak wavelength in the visible spectrum of 465-500 nm, and "deep blue" has a peak wavelength in the visible spectrum of 400-465 nm. Preferred ranges include a peak wavelength in the visible spectrum of 610-640 nm for red and 510-550 nm for green.

To add more specificity to the wavelength-based definitions, "light blue" may be further defined, in addition to having a peak wavelength in the visible spectrum of 465-500 nm that is at least 4 nm greater than that of a deep blue OLED in the same device, as preferably having a CIE x-coordinate less than 0.2 and a CIE y-coordinate less than 0.5, and "deep blue" may be further defined, in addition to having a peak wavelength in the visible spectrum of 400-465 nm, as preferably having a CIE y-coordinate less than 0.15 and preferably less than 0.1, and the difference between the two may be further defined such that the CIE coordinates of light emitted by the third organic light emitting device and the CIE coordinates of light emitted by the fourth organic light emitting device are sufficiently different that the difference in the CIE x-coordinates plus the difference in the CIE y-coordinates is at least 0.01. As defined herein, the peak wavelength is the primary characteristic that defines light and deep blue, and the CIE coordinates are preferred.

More generally, "light blue" may mean having a peak wavelength in the visible spectrum of 400-500 nm, and "deep blue" may mean having a peak wavelength in the visible spectrum of 400-500 nm., and at least 4 nm less than the peak wavelength of the light blue.

In another embodiment, "light blue" may mean having a CIE y coordinate less than 0.25, and "deep blue" may mean having a CIE y coordinate at least 0.02 less than that of "light blue."

In another embodiment, the definitions for light and deep blue provided herein may be combined to reach a narrower definition. For example, any of the CIE definitions may be combined with any of the wavelength definitions. The reason for the various definitions is that wavelengths and CIE coordinates have different strengths and weaknesses when it comes to measuring color. For example, lower wavelengths normally correspond to deeper blue. But a very narrow spectrum having a peak at 472 may be considered "deep blue" when compared to another spectrum having a peak at 471 nm, but a significant tail in the spectrum at higher wavelengths. This scenario is best described using CIE coordinates. It is expected that, in view of available materials for OLEDs, that the wavelength-based definitions are well-suited for most situations. In any event, embodiments of the invention include two different blue pixels, however the difference in blue is measured.

The first, second, third and fourth organic light emitting devices each have an emissive layer that includes an organic material that emits light when an appropriate voltage is applied across the device. Any combination of phosphorescent and fluorescent materials may be used. In one preferred embodiment, the emissive material in each of the first and second organic light emitting devices is a phosphorescent material, emissive material in the third organic light emitting device is a fluorescent material, and the emissive material in the fourth organic light emitting device may be either a fluorescent material or a phosphorescent material. Preferably, the emissive material in the fourth organic light emitting device is a phosphorescent material. In one preferred embodiment, the emissive material in each of the first, second and third light emitting devices is a phosphorescent material, and the emissive material in the fourth organic light emitting device may be either a fluorescent material or a phosphorescent material. Preferably, the emissive material in the fourth organic light emitting device is a phosphorescent material.

"Red" and "green" phosphorescent devices having lifetimes and efficiencies suitable for use in a commercial display are well known and readily achievable, including devices that emit light sufficiently close to the various industry standard reds and greens for use in a display. Examples of such devices are provided in M. S. Weaver, V. Adamovich, B. D'Andrade, B. Ma, R. Kwong, and J. J. Brown, Proceedings of the International Display Manufacturing Conference, pp. 328-331 (2007); see also B. D'Andrade, M. S. Weaver, P. B. MacKenzie, H. Yamamoto, J. J. Brown, N. C. Giebink, S. R. Forrest and M. E. Thompson, Society for Information Display Digest of Technical Papers 34, 2, pp. 712-715 (2008).

An example of a light blue fluorescent device is provided in Jiun-Haw Lee, Yu-Hsuan Ho, Tien-Chin Lill and Chia-Fang Wu, Journal of the Electrochemical Society, 154 (7) J226-J228 (2007). The emissive layer comprises a 9,10-bis(2'-napthyl)anthracene (ADN) host and a 4,4'-bis[2-(4-(N,N-diphenylamino)phenyl)vinyl]biphenyl (DPAVBi) dopant. At 1,000 cd/m$^2$, a device with this emissive layer operates with 18.0 cd/A luminous efficiency and CIE 1931 (x, y)=(0.155, 0.238). Further example of blue fluorescent dopant are given in "Organic Electronics: Materials, Processing, Devices and Applications", Franky So, CRC Press, p 448-p 449 (2009). One particular example is dopant EK9, with 11 cd/A luminous efficiency and CIE 1931 (x, y)=(0.14, 0.19). Further examples are given in patent applications WO 2009/107596 A1 and US 2008/0203905. A particular example of an efficient fluorescent light blue system given in WO 2009/107596 A1 is dopant DM1-1' with host EM2', which gives 19 cd/A efficiency in a device operating at 1,000 cd/m$^2$.

An example of a light blue phosphorescent device has the structure:
ITO (80 nm)/LG101 (10 nm)/NPD (30 nm)/Compound A: Emitter A (30 nm:15%)/Compound A (5 nm)/Alq$_3$ (40 nm)/ LiF (1 nm)/Al (100 nm).
LG101 is available from LG Chem Ltd. of Korea.

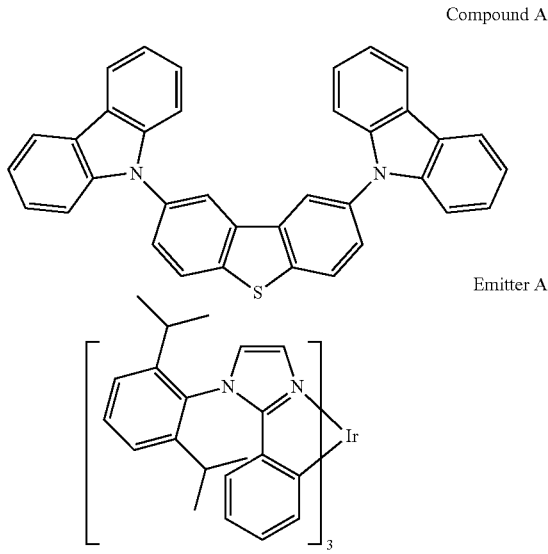

Compound A

Emitter A

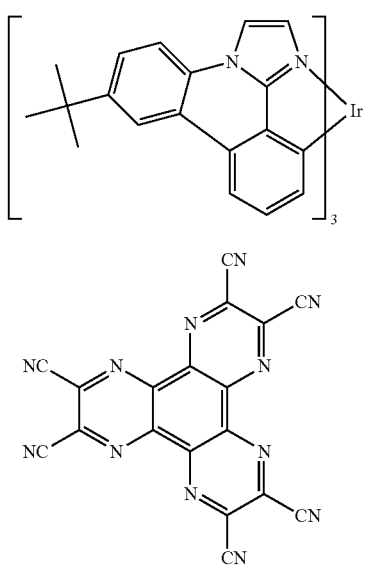

Emitter B

Compound C

Such a device has been measured to have a lifetime of 3,000 hrs from initial luminance 1000 nits at constant dc current to 50% of initial luminance, 1931 CIE coordinates of CIE (0.175, 0.375), and a peak emission wavelength of 474 nm in the visible spectrum.

"Deep blue" devices are also readily achievable, but not necessarily having the lifetime and efficiency properties desired for a display suitable for consumer use. One way to achieve a deep blue device is by using a fluorescent emissive material that emits deep blue, but does not have the high efficiency of a phosphorescent device. An example of a deep blue fluorescent device is provided in Masakazu Funahashi et al., Society for Information Display Digest of Technical Papers 47. 3, pp. 709-711(2008). Funahashi discloses a deep blue fluorescent device having CIE coordinates of (0.140, 0.133) and a peak wavelength of 460 nm. Another way is to use a phosphorescent device having a phosphorescent emissive material that emits light blue, and to adjust the spectrum of light emitted by the device through the use of filters or microcavities. Filters or microcavities can be used to achieve a deep blue device, as described in Baek-Woon Lee, Young In Hwang, Hae-Yeon Lee and Chi Woo Kim and Young-Gu Ju Society for Information Display Digest of Technical Papers 68.4, pp. 1050-1053 (2008), but there may be an associated decrease in device efficiency. Indeed, the same emitter may be used to fabricate a light blue and a deep blue device, due to microcavity differences. Another way is to use available deep blue phosphorescent emissive materials, such as described in United States Patent Publication 2005-0258433, which is incorporated by reference in its entirety and for compounds shown at pages 7-14. However, such devices may have lifetime issues. An example of a suitable deep blue device using a phosphorescent emitter has the structure:
ITO (80 nm)/Compound C (30 nm)/NPD (10 nm)/Compound A: Emitter B (30 nm:9%)/Compound A (5 nm)/Alq3 (30 nm)/LiF (1 nm)/Al (100 nm)
Such a device has been measured to have a lifetime of 600 hrs from initial luminance 1000 nits at constant dc current to 50% of initial luminance, 1931 CIE coordinates of CIE: (0.148, 0.191), and a peak emissive wavelength of 462 nm.

The difference in luminous efficiency and lifetime of deep blue and light blue devices may be significant. For example, the luminous efficiency of a deep blue fluorescent device may be less than 25% or less than 50% of that of a light blue fluorescent device. Similarly, the lifetime of a deep blue fluorescent device may be less than 25% or less than 50% of that of a light blue fluorescent device. A standard way to measure lifetime is $LT_{50}$ at an initial luminance of 1000 nits, i.e., the time required for the light output of a device to fall by 50% when run at a constant current that results in an initial luminance of 1000 nits. The luminous efficiency of a light blue fluorescent device is expected to be lower than the luminous efficiency of a light blue phosphorescent device, however, the operational lifetime of the fluorescent light blue device may be extended in comparison to available phosphorescent light blue devices.

Figure 5:
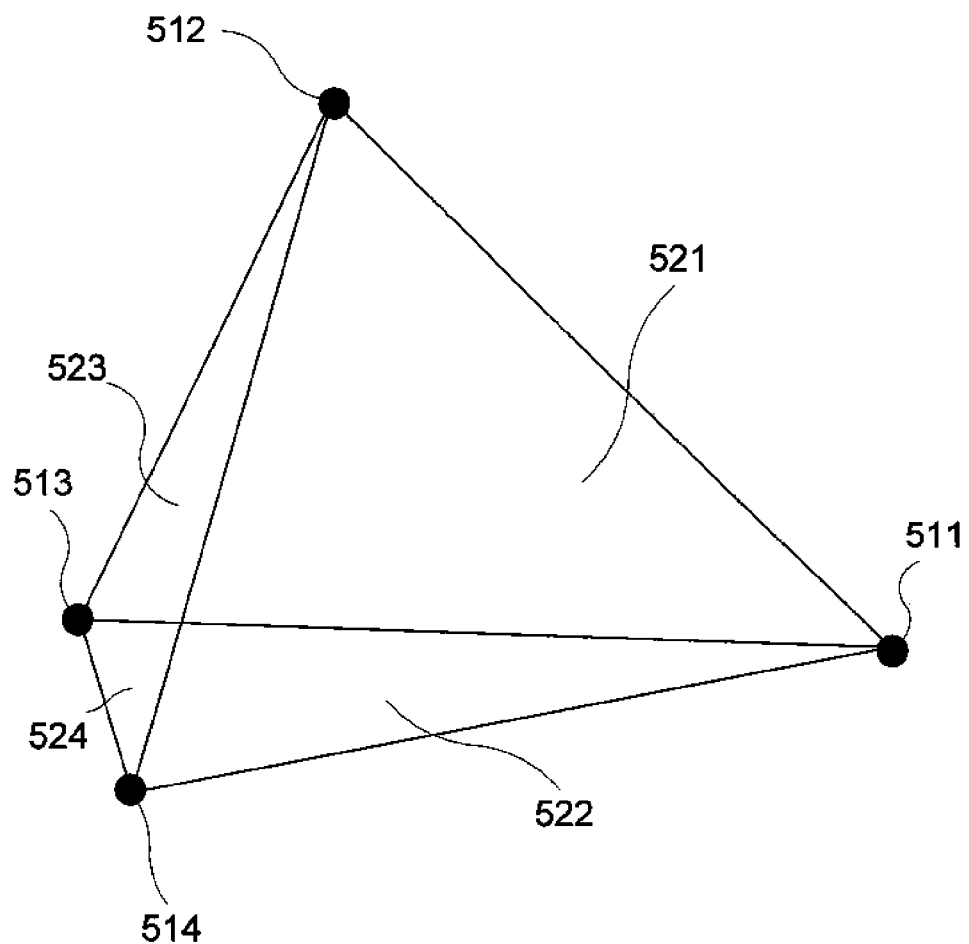
FIG. 5 shows CIE coordinates for various devices.

A device or pixel having four organic light emitting devices, one red, one green, one light blue and one deep blue, may be used to render any color inside the shape defined by the CIE coordinates of the light emitted by the devices on a CIE chromaticity diagram. FIG. 5 illustrates this point. FIG. 5 should be considered with reference to the CIE diagrams of FIGS. 3 and 4, but the actual CIE diagram is not shown in FIG. 5 to make the illustration clearer. In FIG. 5, point 511 represents the CIE coordinates of a red device, point 512 represents the CIE coordinates of a green device, point 513 represents the CIE coordinates of a light blue device, and point 514 represents the CIE coordinates of a deep blue device. The pixel may be used to render any color inside the quadrangle defined by points 511, 512, 513 and 514. If the CIE coordinates of points 511, 512, 513 and 514 correspond to, or at least encircle, the CIE coordinates of devices called for by a standard gamut—such as the corners of the triangles in FIG. 4—the device may be used to render any color in that gamut.

Many of the colors inside the quadrangle defined by points 511, 512, 513 and 514 can be rendered without using the deep blue device. Specifically, any color inside the triangle defined by points 511, 512 and 513 may be rendered without using the deep blue device. The deep blue device would only be needed for colors falling outside of this triangle. Depending upon the color content of the images in question, only minimal use of the deep blue device may be needed.

FIG. 5 shows a "light blue" device having CIE coordinates 513 that are outside the triangle defined by the CIE coordinates 511, 512 and 514 of the red, green and deep blue devices, respectively. Alternatively, the light blue device may have CIE coordinates that fall inside of said triangle.

A preferred way to operate a device having a red, green, light blue and deep blue device, or first, second, third and fourth devices, respectively, as described herein is to render a color using only 3 of the 4 devices at any one time, and to use the deep blue device only when it is needed. Referring to FIG. 5, points 511, 512 and 513 define a first triangle, which includes areas 521 and 523. Points 511, 512 and 514 define a second triangle, which includes areas 521 and 522. Points 512, 513 and 514 define a third triangle, which includes areas 523 and 524. If a desired color has CIE coordinates falling within this first triangle (areas 521 and 523), only the first, second and third devices are used to render the color. If a desired color has CIE coordinates falling within the second triangle, and does not also fall within the first triangle (area 522), only the first, second and fourth devices are used to render color. If a desired color has CIE coordinates falling within the third triangle, and does not fall within the first triangle (area 524), only the first, third and fourth, or only the second, third and fourth devices are used to render color.

Such a device could be operated in other ways as well. For example, all four devices could be used to render color. However, such use may not achieve the purpose of minimizing use of the deep blue device.

Red, green, light blue and blue bottom-emission phosphorescent microcavity devices were fabricated. Luminous efficiency (cd/A) at 1,000 cd/m² and CIE 1931 (x, y) coordinates are summarized for these devices in Table 1 in Rows 1-4. Data for a fluorescent deep blue device in a microcavity are given in Row 5. This data was taken from Woo-Young So et al., paper 44.3, SID Digest (2010) (accepted for publication), and is a typical example for a fluorescent deep blue device in a microcavity. Values for a fluorescent light blue device in a microcavity are given in Row 9. The luminous efficiency given here (16.0 cd/A) is a reasonable estimate of the luminous efficiency that could be demonstrated if the fluorescent light blue materials presented in patent application WO 2009/107596 were built into a microcavity device. The CIE 1931 (x, y) coordinates of the fluorescent light blue device match the coordinates of the light blue phosphorescent device.

Using device data in Table 1, simulations were performed to compare the power consumption of a 2.5-inch diagonal, 80 dpi, AMOLED display with 50% polarizer efficiency, 9.5V drive voltage, and white point (x, y)=(0.31, 0.31) at 300 cd/m². In the model, all sub-pixels have the same active device area. Power consumption was modeled based on 10 typical display images. The following pixel layouts were considered: RGB, where red and green are phosphorescent and the blue device is a fluorescent deep blue; (2) RGB1B2, where the red, green and light blue (B1) are phosphorescent and deep blue (B2) device is a fluorescent deep blue; and (3) RGB1B2, where the red and green are phosphorescent and the light blue (B1) and deep blue (B2) are fluorescent. The average power consumed by (1) was 196 mW, while the average power consumed by (2) was 132 mW. This is a power savings of 33% compared to (1). The power consumed by pixel layout (3) was 157 mW. This is a power savings of 20% compared to (1). This power savings is much greater than one would have expected for a device using a fluorescent blue emitter as the B1 emitter. Moreover, since the device lifetime of such a device would be expected to be substantially longer than an RGB device using only a deeper blue fluorescent emitter, a power savings of 20% in combination with a long lifetime is be highly desirable. Examples of fluorescent light blue materials that might be used include a 9,10-bis(2'-napthyl)anthracene (ADN) host with a 4,4'-bis[2-(4-(N,N-diphenylamino)phenyl)vinyl]biphenyl (DPAVBi) dopant, or dopant EK9 as described in "Organic Electronics: Materials, Processing, Devices and Applications", Franky So, CRC Press, p 448-p 449 (2009), or host EM2' with dopant DM1-1' as described in patent application WO 2009/107596 A1. Further examples of fluorescent materials that could be used are described in patent application US 2008/0203905.

Based on the disclosure herein, pixel layout (3) is expected to result in significant and previously unexpected power savings relative to pixel layout (1) where the light blue (B1) device has a luminous efficiency of at least 12 cd/A. It is preferred that light blue (B1) device has a luminous efficiency of at least 15 cd/A to achieve more significant power savings. In either case, pixel layout (3) may also provide superior lifetime relative to pixel layout (1).

TABLE 1

Device data for bottom-emission microcavity red, green, light blue and deep blue test devices. Rows 1-4 are phosphorescent devices. Rows 5-6 are fluorescent devices.

|  |  |  | Luminous Efficiency | CIE 1931 (x, y) |
|---|---|---|---|---|
| Red | R | Phosphorescent | 48.1 | (0.674, 0.324) |
| Green | G | Phosphorescent | 94.8 | (0.195, 0.755) |
| Light Blue | B1 | Phosphorescent | 22.5 | (0.144, 0.148) |
| Deep Blue | B2 | Phosphorescent | 6.3 | (0.144, 0.061) |
| Deep Blue | B2 | Fluorescent | 4.0 | (0.145, 0.055) |
| Light Blue | B1 | Fluorescent | 16.0 | (0.144, 0.148) |

Algorithms have been developed in conjunction with RGBW (red, green, blue, white) devices that may be used to map a ROB color to an RGBW color. Similar algorithms may be used to map an RGB color to RG B1 B2. Such algorithms, and RGBW devices generally, are disclosed in A. Arnold, T. K. Hatwar, M. Hertel, P. Kane, M. Miller, M. Murdoch, J. Spindler, S. V. Slyke, Proc. Asia Display (2004); J. P. Spindler, T. K. Hatwar, M. E. Miller, A. D. Arnold, M. J. Murdoch, P. J. Lane, J. E. Ludwicki and S. V. Slyke, SID 2005 International Symposium Technical Digest 36, 1, pp. 36-39 (2005) ("Spindler"); Du-Zen Peng, Hsiang-Lun, Hsu and Ryuji Nishikawa. Information Display 23, 2, pp 12-18 (2007) ("Peng"); B-W. Lee, Y. I. Hwang, H-Y, Lee and C. H. Kim, SID 2008 International Symposium Technical Digest 39, 2, pp. 1050-1053 (2008). RGBW displays are significantly different from those disclosed herein because they still need a good deep blue device. Moreover, there is teaching that the "fourth" or white device of an RGBW display should have particular "white" CIE coordinates, see Spindler at 37 and Peng at 13.

Figure 6:
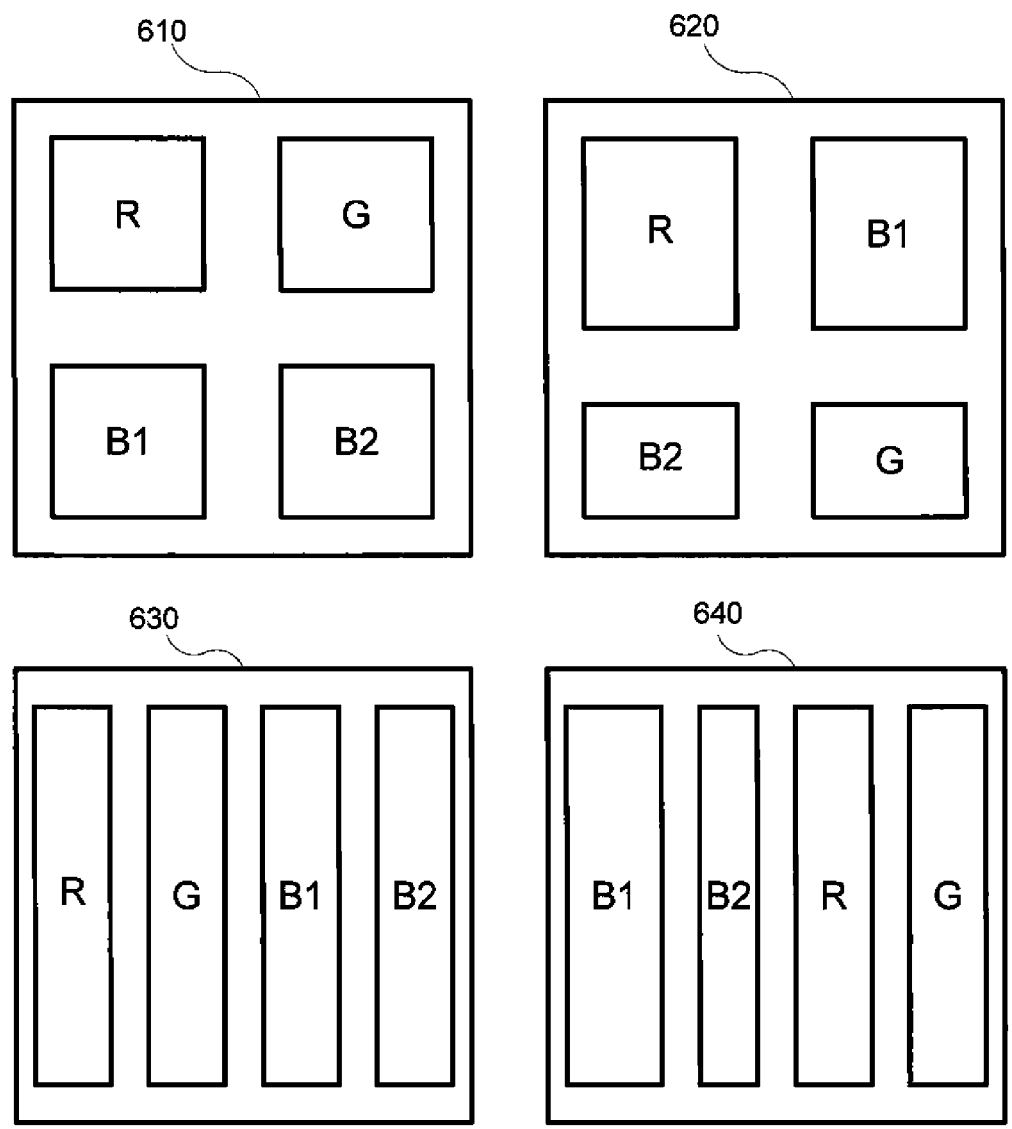
FIG. 6 shows various configurations for a pixel having four sub-pixels.

A device having four different organic light emitting devices, each emitting a different color, may have a number of different configurations. FIG. 6 illustrates some of these configurations. In FIG. 6, R is a red-emitting device, G is a green-emitting device, B1 is a light blue emitting device, and B2 is a deep blue emitting device.

Configuration 610 shows a quad configuration, where the four organic light emitting devices making up the overall device or multicolor pixel are arranged in a two by two array. Each of the individual organic light emitting devices in configuration 610 has the same surface area. In a quad pattern, each pixel could use two gate lines and two data lines.

Configuration 620 shows a quad configuration where some of the devices have surface areas different from the others. It may be desirable to use different surface areas for a variety of reasons. For example, a device having a larger area may be run at a lower current than a similar device with a smaller area to emit the same amount of light. The lower current may increase device lifetime. Thus, using a relatively larger device is one way to compensate for devices having a lower expected lifetime.

Configuration 630 shows equally sized devices arranged in a row, and configuration 640 shows devices arranged in a row where some of the devices have different areas. Patterns other than those specifically illustrated may be used.

Other configurations may be used. For example, a stacked OLED with four separately controllable emissive layers, or two stacked OLEDs each with two separately controllable emissive layers, may be used to achieve four sub-pixels that can each emit a different color of light.

Various types of OLEDs may be used to implement various configurations, including transparent OLEDs and flexible OLEDs.

Displays with devices having four sub-pixels, in any of the various configurations illustrated and in other configurations, may be fabricated and patterned using any of a number of conventional techniques. Examples include shadow mask, laser induced thermal imaging (LITI), ink-jet printing, organic vapor jet printing (OVJP), or other OLED patterning technology. An extra masking or patterning step may be needed for the emissive layer of the fourth device, which may increase fabrication time. The material cost may also be somewhat higher than for a conventional display. These additional costs would be offset by improved display performance.

A single pixel may incorporate more than the four sub-pixels disclosed herein, possibly with more than four discrete colors. However, due to manufacturing concerns, four sub-pixels per pixel is preferred.

An architecture and method is provided for constructing a superposition/spatial color synthesis OLED pixel architecture for an RGB1B2 display. The RG sub-pixels are located in a first device plane separate from a second device plane that includes at least one of the B1 or B2 blue sub-pixels. At least one of the device planes is substantially transparent i.e. TOLEDs (transparent OLEDs). This architecture has many potential advantages over a conventional side by side pixel arrangement. It allows for greater fill factor for some or all devices of a particular color, which may be used to increase the lifetime of the weakest devices, such as the blue devices. For example, the deep blue device, if used as frequently as the other devices, may be the "weakest" device if considered in isolation, i.e., if the lifetime of the device is measured for continuous usage. However, many embodiments of an RGB1B2 display are specifically designed to minimize use of the B2 sub-pixel, such that the B1 sub-pixel may be the weakest device when factors such as average use are considered in addition to device lifetime in isolation.

As used herein, "fill factor" refers to the ratio of the area of emissive device surface to an outline of the area that includes emissive device surface. Fill factor is intended to quantify the inactive area between devices, where a high fill factor corresponds to a low inactive area between devices. Fill factor is also affected by any device area that does not emit light that reaches a viewer for whatever reason, such as placement of thin film transistors that are not transparent. Thus, any inactive panel area around the periphery of a panel with no devices is not considered in the calculation of fill factor as used herein.

The 2 planes of OLED sub-pixels can be constructed in a variety of ways. For example the first and second device planes could be constructed on 2 separate backplanes and then be attached together where one of the backplanes is substantially transparent. Alternatively the two device planes could be constructed on top of each other fabricated over one backplane using stacked OLED (SOLED) technology where the 2 planes are individually addressable. One way to fabricate two device planes one on top of the other over one backplane is to use a fine metal mask and vapor thermal evaporation (VTE) to fabricate the first device plane.

Embodiments of the invention may be used for displays capable of displaying images. Embodiments of the invention may be used for general illumination purposes, where the light source may or may not be color tunable. While a light source that produces white light is a preferred embodiment, other colors of light may also be produced.

A first device is provided. The device includes a plurality of pixels, wherein each pixel includes an R sub-pixel, a G sub-pixel, a B1 sub-pixel and a B2 sub-pixel. Each R sub-pixel comprises a first organic light emitting device that emits light having a peak wavelength in the visible spectrum of 580-700 nm, further comprising a first emissive layer having a first emitting material. Each G sub-pixel comprises a second organic light emitting device that emits light having a peak wavelength in the visible spectrum of 500-580 nm, further comprising a second emissive layer having a second emitting material. Each B1 sub-pixel comprises a third organic light emitting device that emits light having a peak wavelength in the visible spectrum of 400-500 nm, further comprising a third emissive layer having a third emitting material. Each B2 sub-pixel comprises a fourth organic light emitting device that emits light having a peak wavelength in the visible spectrum of 400 to 500 nm, further comprising a fourth emissive layer having a fourth emitting material. The third emitting material is different from the fourth emitting material. The peak wavelength in the visible spectrum of light emitted by the fourth organic light emitting device is at least 4 nm less than the peak wavelength in the visible spectrum of light emitted by the third organic light emitting device.

The first device includes a first device plane and a second device plane. The first device plane comprises a plurality of the first organic light emitting device and a plurality of the second organic light emitting device. The second device plane comprises a plurality of at least one of the third organic light emitting device and the fourth organic light emitting device. The planes of the first and second device planes are parallel. The second device plane is transposed from the first device plane in a direction perpendicular to the planes of the first and second device planes. The first and second device planes are superposed.

In one embodiment, the second device plane comprises a plurality of the third organic light emitting device, and a plurality of the fourth organic light emitting device.

In one embodiment, the first device plane comprises a plurality of the first organic light emitting device, a plurality of the second organic light emitting device, and a plurality of the third organic light emitting device. The second device plane comprises a plurality of the fourth organic light emitting device.

In one embodiment, the first device plane comprises a plurality of the first organic light emitting device, a plurality of the second organic light emitting device, and a plurality of the fourth organic light emitting device. The second device plane comprises a plurality of the third organic light emitting device.

Preferably, at least one of the first and second device planes each has a fill factor of at least 30%.

Preferably, the first device is configured such that the first device plane is closer to a viewing direction than the second device plane.

The first device may be a display panel. The first device may be a consumer device.

In one preferred embodiment, the first, second and third emitting materials are phosphorescent, and the fourth emitting material is fluorescent. In one preferred embodiment, the first and second emitting materials are phosphorescent, and the third and fourth emitting materials are fluorescent. A variety of other combinations of emitting material types may be used, such as where the first, second, third and fourth emitting materials are phosphorescent.

Figure 7:
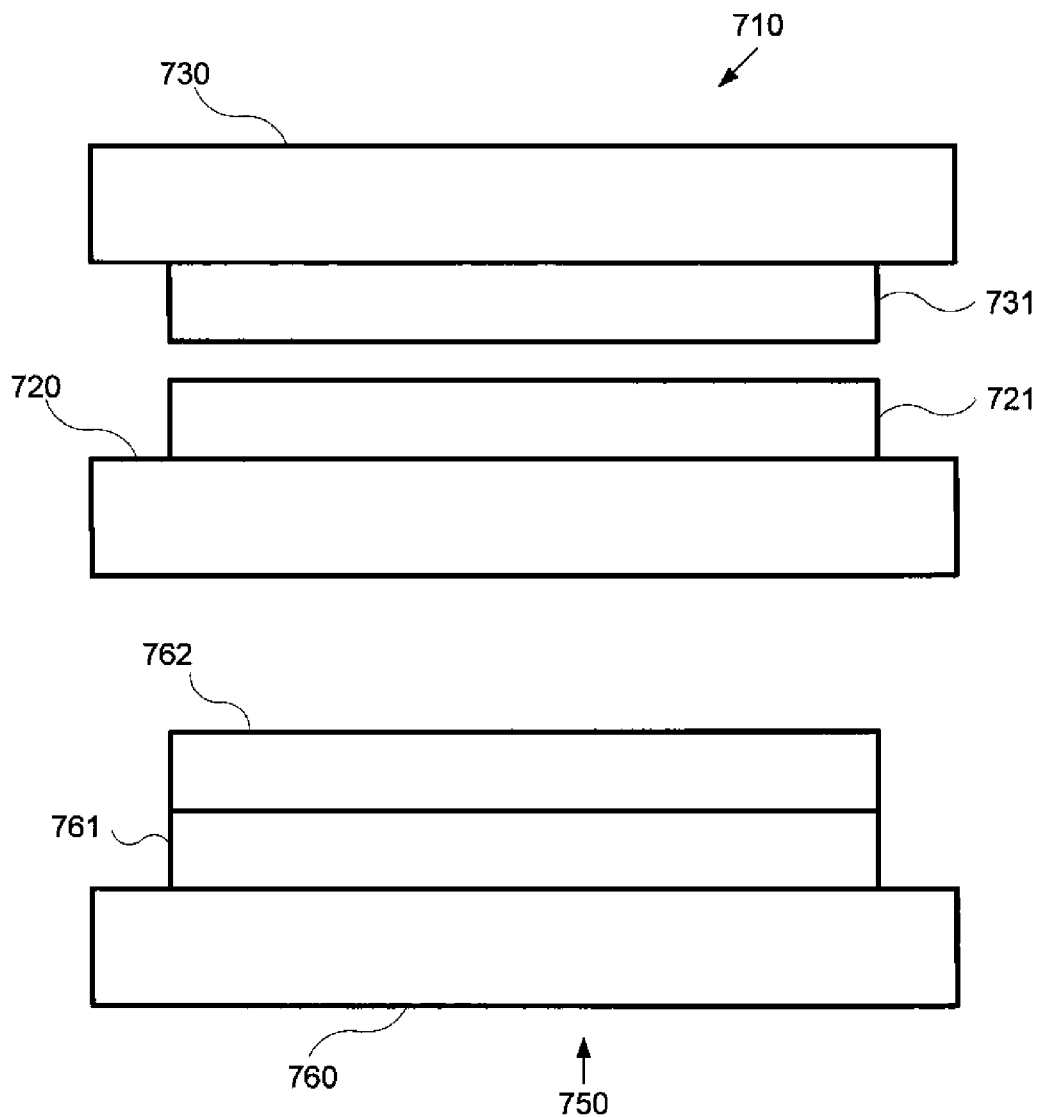
FIG. 7 shows two different configurations providing two device planes.

FIG. 7 shows two different configurations providing two device planes. A first configuration 710 shows a first device plane 721 fabricated on a first substrate (or backplane) 720. A second device plane 731 is fabricated on a second substrate 730. The first and second substrates may be attached by any conventional method, such as lamination.

A second configuration 750 shows a first substrate 760 having first and second device planes 761 and 762 stacked thereon in that order.

Figure 8:
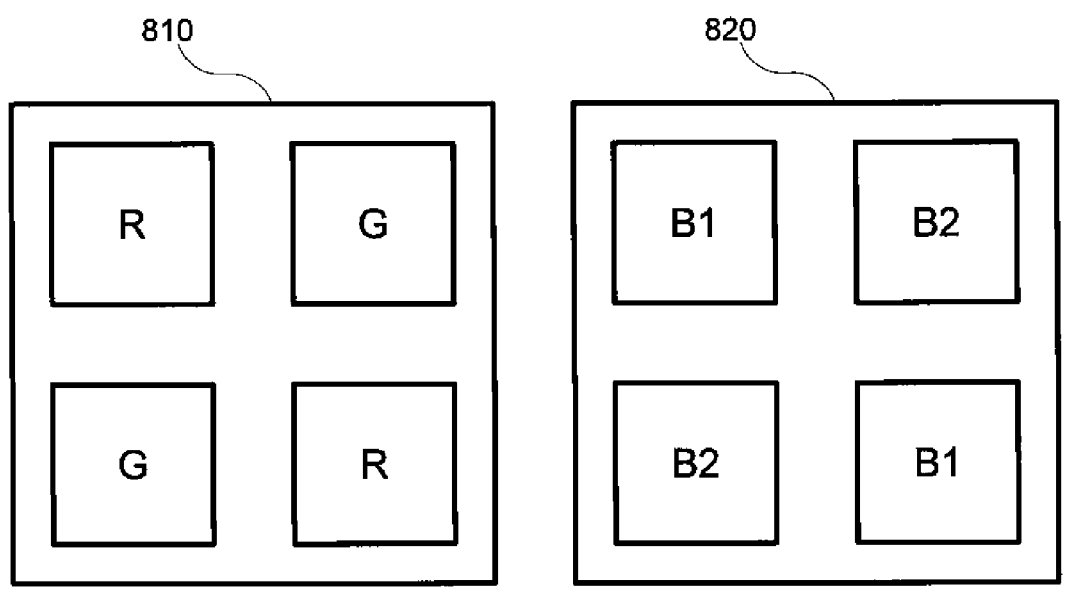
FIG. 8 shows a first way to split R, G, B1 and B2 devices between two device planes.

FIG. 8 shows a first way to split R, G, B1 and B2 devices between two device planes. A first device plane 810 has R and G sub-pixels disposed thereon. A second device plane 820 has B1 and B2 sub-pixels disposed thereon. First device plane 810 and second device plane 820 of FIG. 8 may correspond to first device plane 721 and second device plane 731 of FIG. 7, respectively. Alternatively, first device plane 810 and second device plane 820 of FIG. 8 may correspond to second device plane 731 and first device plane 721 of FIG. 7, respectively. First device plane 810 and second device plane 820 of FIG. 8 may correspond to first device plane 761 and second device plane 762 of FIG. 7, respectively. Alternatively, first device plane 810 and second device plane 820 of FIG. 8 may correspond to second device plane 762 and first device plane 761 of FIG. 7, respectively.

Figure 9:
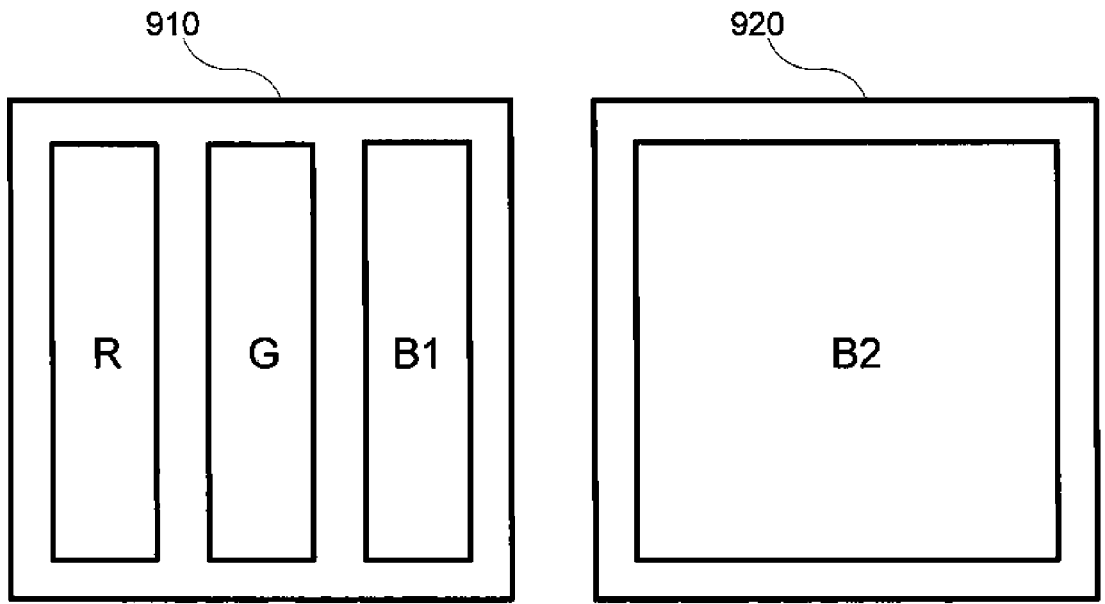
FIG. 9 shows a second way to split R, G, B1 and B2 devices between two device planes.

FIG. 9 shows a second way to split R, G, B1 and B2 devices between two device planes. A first device plane 910 has R, G and B1 sub-pixels disposed thereon. A second device plane 920 has B2 sub-pixels disposed thereon. First device plane 910 and second device plane 920 of FIG. 9 may correspond to first device plane 721 and second device plane 731 of FIG. 7, respectively. Alternatively, first device plane 910 and second device plane 920 of FIG. 9 may correspond to second device plane 731 and first device plane 721 of FIG. 7, respectively. First device plane 910 and second device plane 920 of FIG. 9 may correspond to first device plane 761 and second device plane 762 of FIG. 7, respectively. Alternatively, first device plane 910 and second device plane 920 of FIG. 9 may correspond to second device plane 762 and first device plane 761 of FIG. 7, respectively.

Figure 10:
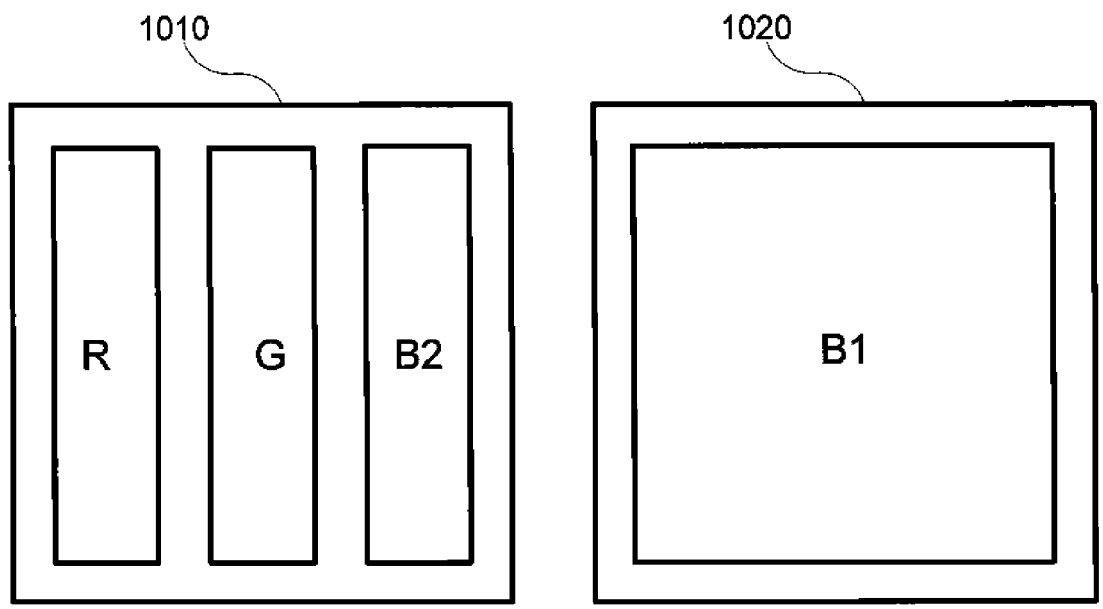
FIG. 10 shows a third way to split R, G, B1 and B2 devices between two device planes.

FIG. 10 shows a third way to split R, G, B1 and B2 devices between two device planes. A first device plane 1010 has R, G and B2 sub-pixels disposed thereon. A second device plane 1020 has B1 sub-pixels disposed thereon. First device plane 1010 and second device plane 1020 of FIG. 10 may correspond to first device plane 721 and second device plane 731 of FIG. 7, respectively. Alternatively, first device plane 1010 and second device plane 1020 of FIG. 10 may correspond to second device plane 731 and first device plane 721 of FIG. 7, respectively. First device plane 1010 and second device plane 1020 of FIG. 10 may correspond to first device plane 761 and second device plane 762 of FIG. 7, respectively. Alternatively, first device plane 1010 and second device plane 1020 of FIG. 9 may correspond to second device plane 762 and first device plane 761 of FIG. 7, respectively.

Figure 11:
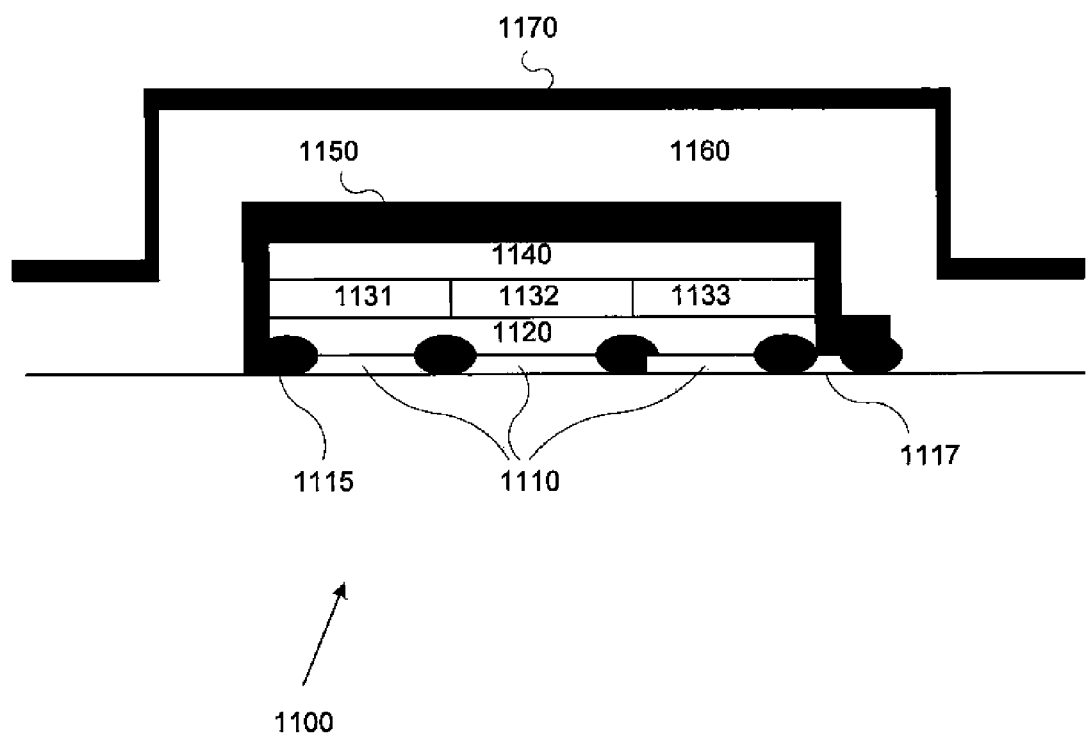
FIG. 11 shows a device architecture for a R, G, B1 and B2 devices split between two device planes having a common electrode between the two device planes.
Figure 12:
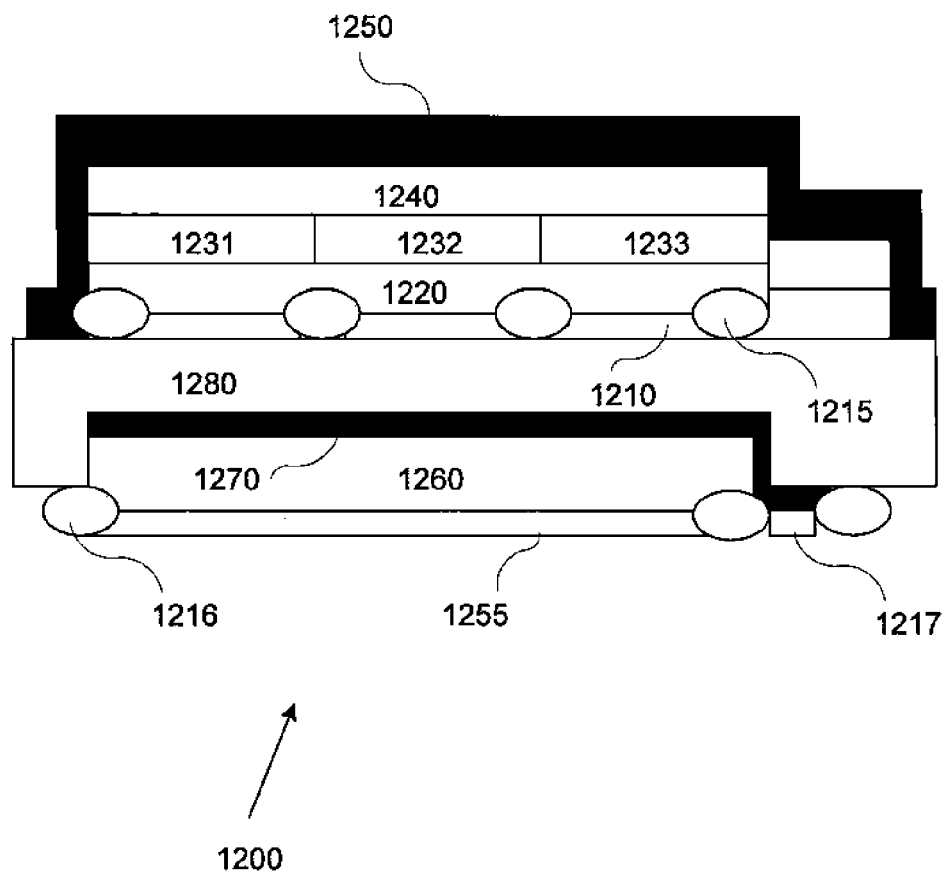
FIG. 12 shows a device architecture for a R, G, B1 and B2 devices split between two device planes having a passivation layer between the two device planes.

FIG. 11 shows a specific device architecture 1100 for a R, G, B1 and B2 devices split between two device planes having a common electrode between the two device planes. In FIGS. 11 and 12, where no arrow or connecting line is present, a reference numeral refers to the layer on which it appears. The architecture includes anodes 1110 for each of an R, G and B2 device that are individually addressable and electrically separated by insulating grid 1115. Electronics that are most often located in the substrate, such as transistors and contact pads for each anode, are not shown. An organic hole transport layer 1120 common to each of the R, G and B2 devices is disposed over anodes 1110. Individually patterned organic emissive layers 1131, 1132 and 1133, for R, G and B2 devices, respectively, are disposed over organic hole transport layer 1120. Individually patterned organic emissive layers 1131, 1132 and 1133 include different emissive materials suitable for use with R, G and B2 devices, respectively An organic electron transport layer 1140 common to each of the R, G and B2 devices is disposed over emissive layers 1131, 1132 and 1133. An electrode 1150 is disposed over organic electron transport layer 1140, and is also connected to contact pad 1117. Electrode 1150 acts as a cathode for the R, G and B2 devices, and as an anode for the B1 device. Organic emissive layer 1160, which includes an emissive material suitable for use with a B1 device, is disposed over electrode 1150. Cathode 1170 is disposed over organic emissive layer 1160.

FIG. 12 shows a specific device architecture 1200 for a R, G, B1 and B2 devices split between two device planes having a passivation layer 1280 between the two device planes. The architecture includes anodes 1210 for each of an R, G and B2 device that are individually addressable and electrically separated by insulating grid 1215. Electronics that are most often located in the substrate, such as transistors and contact pads for each anode, are not shown. An organic hole transport layer 1220 common to each of the R, G and B2 devices is disposed over anodes 1210. Individually patterned organic emissive layers 1231, 1232 and 1233, for R, G and B2 devices, respectively, are disposed over organic hole transport layer 1220. Individually patterned organic emissive layers 1231, 1232 and 1233 include different emissive materials suitable for use with R, G and B2 devices, respectively An organic electron transport layer 1240 common to each of the R, G and B2 devices is disposed over emissive layers 1231, 1232 and 1233. Residual parts of organic hole and transport layers 1220 and 1240 are disposed to the right of organic emissive layer 1233. An electrode 1250 is disposed over organic electron transport layer 1240, and is also connected to the grid. Electrode 1250 acts as a cathode for the R, G and B2 devices. A passivation layer 1280 separates the B1 device from the R, G and B2 devices. Organic emissive layer 1260, which includes an emissive material suitable for use with a B I device, is disposed between anode 1255 and cathode 1270. Anode 1255 is connected to grid 1261. Cathode 1270 is connected to contact pad 1217.

Each of the organic "layers" in device architectures 1100 and 1200 may represent multiple organic layers that are patterned similarly, for example by being deposited through the same shadow mask. Thus, for example, hole transport layers 1120 and 1220 may include a hole injection layer, a hole transport layer, and an electron blocking layer. Emissive layers 1160 and 1260 may include all of the layers of an OLED device, including injection layers, transport layers and blocking layers. The criteria for labeling separate layers in FIGS. 11 and 12 is whether the layers are adjacent and similarly patterned, such that they could, for example, be deposited sequentially through the same shadow mask.

It is understood that the various embodiments described herein are by way of example only, and are not intended to limit the scope of the invention. For example, many of the materials and structures described herein may be substituted with other materials and structures without deviating from the spirit of the invention. Many of the specific arrangements of sub-pixels may be modified without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:
1. A first device, comprising:
a plurality of pixels, wherein each pixel includes an R sub-pixel, a G sub-pixel, a B1 sub-pixel and a B2 sub-pixel, wherein:
each R sub-pixel comprises a first organic light emitting device that emits light having a peak wavelength in the visible spectrum of 580-700 nm, further comprising a first emissive layer having a first emitting material;

each G sub-pixel comprises a second organic light emitting device that emits light having a peak wavelength in the visible spectrum of 500-580 nm, further comprising a second emissive layer having a second emitting material;

each B1 sub-pixel comprises a third organic light emitting device that emits light having a peak wavelength in the visible spectrum of 400-500 nm, further comprising a third emissive layer having a third emitting material;

each B2 sub-pixel comprises a fourth organic light emitting device that emits light having a peak wavelength in the visible spectrum of 400 to 500 nm, further comprising a fourth emissive layer having a fourth emitting material;

the third emitting material is different from the fourth emitting material; and the peak wavelength in the visible spectrum of light emitted by the fourth organic light emitting device is at least 4 nm less than the peak wavelength in the visible spectrum of light emitted by the third organic light emitting device;

a first device plane comprising a plurality of the first organic light emitting device and a plurality of the second organic light emitting device, wherein the first device plane is parallel to the plane of the plurality of the first organic light emitting device and a plurality of the second organic light emitting device;

a second device plane comprising a plurality of at least one of the third organic light emitting device and the fourth organic light emitting device, wherein the second device plane is parallel to the Diane of the at least one of the third organic light emitting device and fourth organic light emitting device;

wherein the planes of the first and second device planes are parallel, the second device plane is transposed from the first device plane in a direction perpendicular to the planes of the first and second device planes, and the first and second device planes are superposed.

2. The first device of claim 1, wherein the second device plane comprises a plurality of the third organic light emitting device, and a plurality of the fourth organic light emitting device.

3. The first device of claim 1, wherein the first device plane comprises a plurality of the first organic light emitting device, a plurality of the second organic light emitting device, and a plurality of the third organic light emitting device, and the second device plane comprises a plurality of the fourth organic light emitting device.

4. The first device of claim 1, wherein the first device plane comprises a plurality of the first organic light emitting device, a plurality of the second organic light emitting device, and a plurality of the fourth organic light emitting device, and the second device plane comprises a plurality of the third organic light emitting device.

5. The first device of claim 1, wherein at least one of the first and second device planes has a fill factor of at least 30%.

6. The first device of claim 1, wherein the first device is configured such that the first device plane is closer to a viewing direction than the second device plane.

7. The first device of claim 1, wherein the first device is a display panel.

8. The first device of claim 1, wherein the first device is a consumer device.

9. The first device of claim 1, wherein the first, second and third emitting materials are phosphorescent, and the fourth emitting material is fluorescent.

10. The first device of claim 1, wherein the first, second, third and fourth emitting materials are phosphorescent.

11. The first device of claim 1, wherein the first and second materials are phosphorescent, and the third and fourth emitting materials are fluorescent.

* * * * *